United States Patent [19]
Sasaki et al.

[11] 3,985,914
[45] Oct. 12, 1976

[54] METHOD FOR CONTINUOUSLY POLARIZING THERMOPLASTIC FILM

[75] Inventors: Tohru Sasaki; Takao Ichii; Shuji Terasaki, all of Iwaki, Japan

[73] Assignee: Kureha Kagaku Kogyo Kabushiki Kaisha, Tokyo, Japan

[22] Filed: Sept. 10, 1975

[21] Appl. No.: 612,144

[30] Foreign Application Priority Data
Sept. 11, 1974   Japan.............................. 49-103863

[52] U.S. Cl.................................... 427/12; 29/592;
179/111 E; 307/88 ET; 427/100
[51] Int. Cl.² ......................................... H01G 7/02
[58] Field of Search....................... 427/12, 13, 100;
307/88 ET; 179/111 E; 29/592, 25.42, 25.35

[56] References Cited
UNITED STATES PATENTS 3,496,013   2/1970   Baxt et al.............................. 427/12

3,696,505   10/1972   Turnhoot........................ 307/88 ET

FOREIGN PATENTS OR APPLICATIONS
1,230,404   5/1971   United Kingdom............. 307/88 ET

*Primary Examiner*—John H. Newsome
*Attorney, Agent, or Firm*—Sughrue, Rothwell, Mion, Zinn and Macpeak

[57] ABSTRACT

For making a piezoelectric thermoplastic film device, a polar thermoplastic film is provided on both sides thereof with conductive layers which function as polarizing electrodes during the polarizing step. In a polarizing zone, a polarizing voltage is applied across the electrodes while the film is heated to a suitable polarizing temperature. To reduce undesirable capacitive effects, at least one electrode layer is separated into sections by narrow insulating regions extending transversely across the film. After cooling, the polarizing voltage and the accumulated electric charges in the film are removed.

8 Claims, 5 Drawing Figures

3,985,914

METHOD FOR CONTINUOUSLY POLARIZING THERMOPLASTIC FILM

BACKGROUND OF THE INVENTION

1. Field of the Invention

This invention relates to a method for continuously polarizing a thermoplastic film, and, more particularly, to a method wherein a polar thermoplastic film is passed through a polarizing zone while subjected to a high voltage, and is thus polarized therein at a polarizing temperature thereby to produce a piezoelectric thermoplastic film at a high efficiency and a high yield rate.

2. Description of the Prior Art

There is known the art of producing a piezoelectric thermoplastic film by polarizing a film made of a polar thermoplastic substance, such as polyvinylidene fluoride, polyvinyl fluoride, or polycarbonate, by the application of a high D.C. electric field at a polarizing temperature.

For instance, electrically conductive layers are deposited on both surfaces of a film made of a polar thermoplastic substance as described above, by sputtering, plating, printing, or the like suitable procedure, and a D.C. voltage is applied across the electrodes formed by the electrically conductive layers deposited on the surfaces of the film thereby to polarize the same film at a polarizing temperature. In this case, application of as high a voltage as possible can produce a film showing higher piezoelectricity so long as no insulation breakdown occurs at the polarizing temperature which is selected as a temperature higher than 50° C and lower than the softening point of the film, this temperature preferably being higher than 80° and lower than 180° C, although a peak value thereof may be observed for rendering a highest piezoelectricity.

Since it is troublesome to polarize films one by one in a batch manner, in an industrial method, a long film deposited with electrodes on both surfaces thereof is preferably continuously passed through a polarizing zone and polarized therein by the application of a D.C. voltage and a polarizing temperature.

However, in the realization of the above described polarization, the following difficulties must be overcome.

The thermoplastic piezoelectric film has a high dielectric constant because of its polar nature, and therefore can form a capacitor which stores a high electric energy upon the application of a D.C. high voltage at the time of the polarization, the amount of this energy being proportional to the capacitance of the capacitor and the square of the applied voltage. Furthermore, the capacitance of the capacitor is proportional to the area of the electrodes made of the electrically conductive layers and also to the dielectric constant of the film substance. For this reason, a greater energy is stored on the film at the time of the polarization when the area of the film subjected to the high voltage is wider. In the case where the film constituting a capacitor during the polarization is dielectrically broken down in those portions containing electrical defects, the energy stored in the capacitor is instantaneously discharged. Due to the discharge, not only is the broken-down portion enlarged, but also the surrounding electrodes are evaporated by the heat of the discharge, whereby the effect of the defective portion is multiplied, and the production yield is remarkably lowered. When the length of the film increases with the width of the long film being constant, the damage to the film is enlarged for this reason.

Furthermore, when the polarization of the thermoplastic film is carried out at a high temperature near the softening point of the film, a slight increase in the polarizing temperature causes softening of the film, and furthermore, since even if the softening of the film does not occur, the dielectric strength of the film is lowered in accordance with the temperature rise, and the above-described dielectrical breakdown is accelerated. Such a problem is liable to occur when a thin film is polarized at a high voltage in the neighborhood of the breakdown voltage.

In addition, the large capacitance of the capacitor formed on the film causes a heavy initial current when the capacitor is connected with an electric power source, such a fact necessitating a greater capacity of the power source, and also a greater size of the device for preventing a high-voltage problem.

The film blank to be polarized is wound on a supply roll, and after polarization, the film is again wound onto a delivering roll, except in the case where the polarized film is without intermission cut into pieces of a suitable size. On these rolls, if the electrodes on both surfaces of the film blank or the polarized film are respectively continuous, electric discharge tends to occur between the electrodes on the front and rear film surfaces which come into contact with each other when the film is wound on these rolls. Although this electric discharge can be avoided by (1) interleaving an insulating film between the coils in the rolls, or (2) by polarizing two films with the use of two electrode combinations, and when rolling, placing the electrodes of a first polarity in contact with each other, thereby leaving both exposed surfaces of the combined layer with the second polarity (in this case, the outer surfaces of the two layers of the films in an overlapping relation are of the same polarity, and no electric discharge occurs when the two layers are wound on the rolls), it is not desirable from the viewpoint of hazard prevention to apply a high voltage to the parts of the film wound on the supply and delivering rolls. If the polarized film is to be cut into pieces of a suitable size, it is dangerous to do so because of the presence of a high voltage.

SUMMARY OF THE INVENTION

According to the present invention there is provided a method for continuously polarizing polar thermoplastic film, of great length and having electrically conductive layers on both surfaces thereof, by passing the film through a polarizing zone. In this method, at least one of the electrically conductive layers constituting two electrodes, preferably the anode, is separated at positions into a number of sections by interposing narrow insulating regions therebetween, and the narrow regions are disposed approximately at right angles to the longitudinal direction of the thermoplastic film, whereby a high voltage applied across the film is localized to a comparatively short section extending over the polarizing zone at a polarizing temperature higher than 50° C and lower than the softening point of the film. Furthermore, in the present invention, the electric field is removed after the polarization, and then electrical charges accumulated between the two electrically conductive layers are removed.

DETAILED DESCRIPTION OF THE PREFERRED EMBODIMENTS

The invention will now be described in detail with reference to the accompanying drawing.

Figure 1:
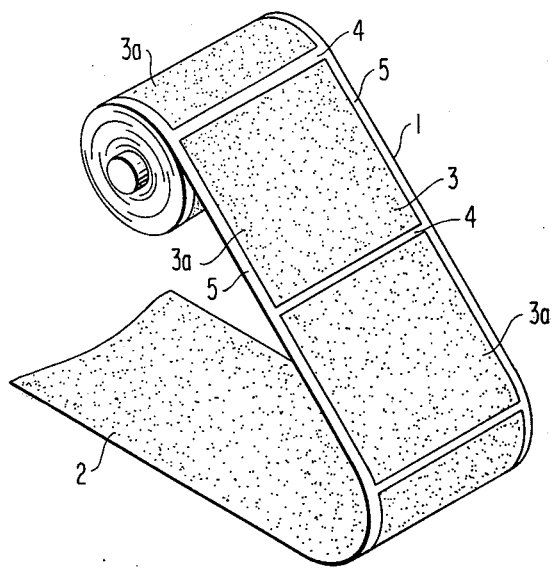
FIG. 1 is a perspective view showing an example of a thermoplastic film having electrodes on both sides thereof and to be polarized according to this invention.

In FIG. 1, a polar thermoplastic film 1 has an electrically conductive layer 2 (cathode) deposited on the entire surface on one side of the film 1, and another electrically conductive layer 3 (anode) on the other side of the film but divided into separate sections 3a by narrow insulating regions 4 interposed therebetween, these sections lacking the electrically conductive layer. Numeral 5 designates marginal areas, also lacking the conductive layer, provided along the longitudinal edges of the thermoplastic film 1, so that the occurrence of short circuit between the two electrically conductive layers 2 and 3 due to a high polarizing voltage can be prevented. The marginal areas 5 may be provided on one surface of the film 1, as shown in the drawing, or on both surfaces of the same film.

Figure 2:
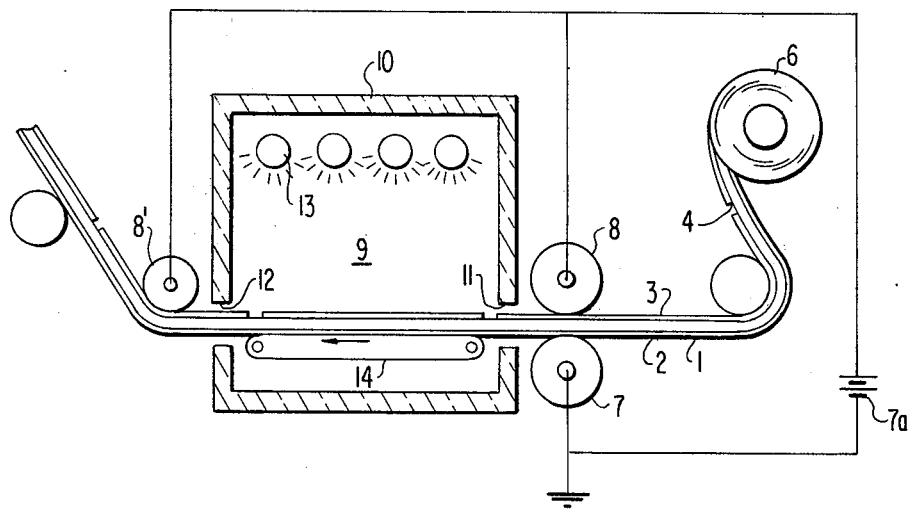
FIGS. 2 through 4 are schematic diagrams showing embodiments of the process for polarizing the film according to this invention.
Figure 3:
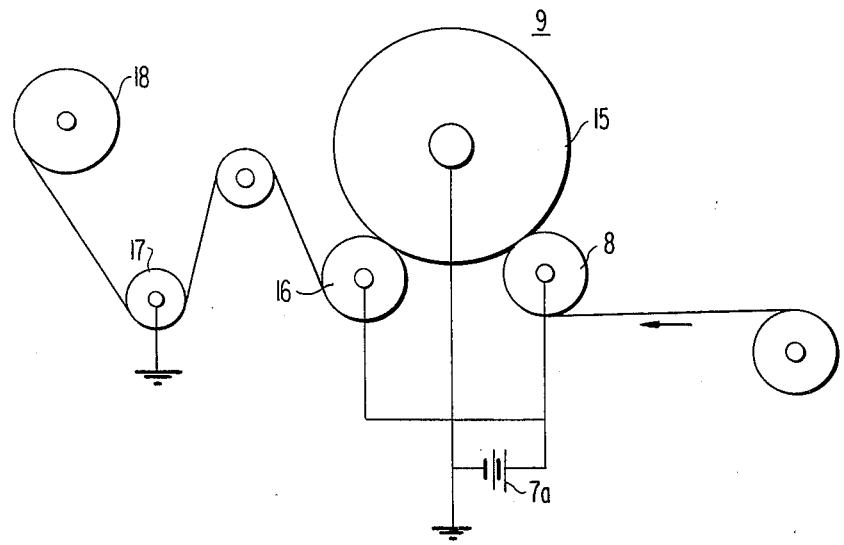

As clearly indicated in FIG. 2, the film 1 taken out of the supply roll 6 is passed between rollers 7 and 8 respectively connected with the terminals of a D.C. high voltage source 7a, so that the electrically conductive layers on both surfaces of the film 1 are brought into contact with the two rollers 7 and 8, and such that the roller 7 is connected to the negative pole which is grounded and the roller 8 to the positive pole of the source. As a result, the high voltage from the power source is applied across the film 1, and the film is in this state sent into a polarizing zone 9. The polarizing zone 9 may be of a type having a chamber surrounded by a heat-insulating wall 10 as indicated in FIG. 2, or a type formed into a heat drum as shown in FIG. 3 and which contacts the film 1 to heat it. In either of the cases, the application of the D.C. voltage and the heating of the film 1 can be carried out simultaneously. When a heat chamber as shown in FIG. 2 is used for the polarizing zone 9, the film with the D.C. voltage applied thereto is guided into the polarizing chamber through a slit 11 and delivered through another slit 12. The heating of the polarizing chamber may be imparted by a heater 13 as indicated, or by heated air supplied from the outside and circulated in the chamber, or by any other heating procedure publicly known in the art such as induction heating. Numeral 14 designates a conveyor used to feed the film 1 and can be eliminated when it is not required.

On the delivery side of the polarizing chamber, another contact roller 8' constituting an electrode is provided. Accordingly, the length of the electrically conductive layer section 3a can be so selected that the layer section 3a all the time contacts either of the contact rollers 8 or 8', so that the voltage is continuously applied to the film passing through the polarizing zone. Ordinarily the length of a section layer 3a is selected to be slightly longer than the distance between the two rollers 8 and 8', and therefore the above-described narrow insulating regions 4 are provided at positions adapted to achieve this section length. The width of the insulating regions 4 may be any suitable value which will prevent electric discharge thereacross. Although this width may be less than 1 mm, it is ordinarily in the range of from 2 mm to 50 mm. Of course, a width greater than this range may be adopted, but it should be noted that the insulating regions 4 constitute wasteful parts which are not polarized.

In the case where the electric field is removed when the polarized film is still at a high temperature, the piezoelectricity thereby obtained tends to be lowered in some extent. For this reason, it is advantageous that the voltage be removed after the film is cooled sufficiently. It is found that the removal of the voltage at a temperature lower than 80° C produces no recognizable reduction of the piezoelectricity, but that such a reduction is unavoidable if the voltage is removed when the polarizing temperature is higher than 80° C.

In FIG. 3, there is indicated another example wherein the polarizing zone is in the form of a rotating drum 15 heated to a polarizing temperature. The entering film supplied with a voltage through a contact roller 8 is heated and polarized on the rotating drum 15 the surface of which is heated to the polarizing temperature and connected to the negative pole of the power source, and then cooled on a cooling drum 16. The same voltage as applied to the roller 8 is also applied to the drum or roller 16, and therefore the electrically conductive layer on the film may have a length such that it is in contact with either one of the rollers 8 and 16 during its passage through the heating drum 15. The electric charge stored on both surfaces of the film remains after the departure from the voltage applying rollers, and hence it is advantageous to remove the electric charge before winding the film on the delivery roll 18. Numeral 17 designates a grounded roller electrode for removing the remaining electric charge. The film from which electric charge is thus removed is finally wound on the delivery roll 18. Alternatively, the film from which electric charge is removed may be cut to a suitable size.

Figure 4:
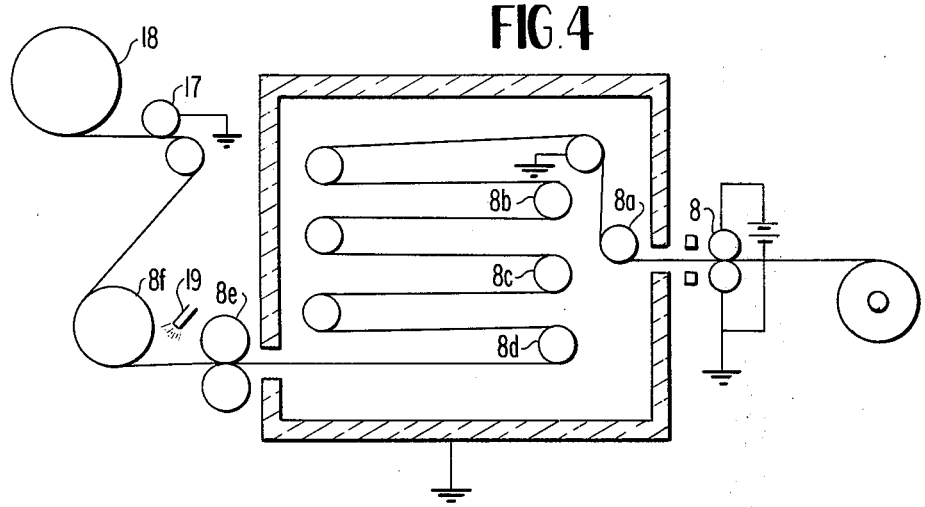

In FIG. 4, there is indicated still another example in which the polarizing zone is made into a far greater size, thereby allowing high efficiency polarization. In the example, since the path of the film in the polarization zone is considerably long, any attempt to provide an electrically conductive layer extending over the long path will result in an accompanying excessive capacitance. For obviating this disadvantage, additional contact electrode rollers 8a, 8b, 8c and 8d are provided in the polarizing chamber, and the electrically conductive layer 3 (not shown in FIG. 4) is made to have a length sufficient at least to always contact any one of these electrode rollers. The film leaving the polarizing zone has the voltage continuously applied thereto through the electrode rollers 8e and 8f until the film is cooled by a cooling air nozzle 19. The film thus cooled is brought into contact with a grounded electrode 17 thereby to remove voltage, and the film is thereafter wound on a delivering roll 18.

In the above description, although it is assumed that the electrically conductive layer deposited on the side of the film contacting the grounded electrodes is continuous in its entirety, both of the conductive layers on the surfaces of the film may be separated into sections by the insulation regions 4. In this case, however, a plurality of ground electrodes are duly provided to contact all of the sections of the electrically conductive layer 2 to be grounded.

Figure 5:
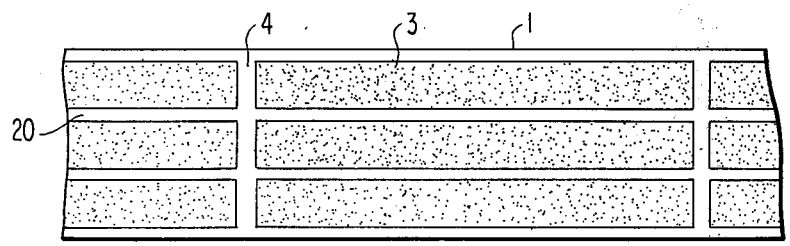
FIG. 5 is a plan view showing another example of thermoplastic film having electrodes on both sides thereof.

When it is required, a desired number of insulating regions 20 may also be provided in the longitudinal direction of the film as shown in FIG. 5, and the capacity of the capacitor formed on the film can be thereby reduced even in a case where the lateral width of the film is substantially large.

The length of a unit section of the discrete conductive layer sections is selected in consideration of the width of the electrically conductive layer, and the polarizing device, particularly the distance between the electrodes provided in the device for contacting the discrete conductive layer sections, and else. However, if the length of the unit section is excessively short, the insulating regions, which constitute a wasteful part because of polarization loss, become excessive. When the length of the unit section is selected to be excessively long, the capacitance of the capacitor as described hereinbefore becomes excessively large, and furthermore, the distance between the voltage applying means and the voltage removing means becomes excessively great. For this reason, the length of the unit conductive layer is selected to be in the range of from 0.5 m to 20 m, preferably from 1 m to 15 m. Furthermore, the area of the unit conductive layer which is effective as an electrode is restricted to a certain range; namely, while the upper limit can be varied with the voltage applied, it is desirable to restrict the area to 5 m$^2$ or smaller. The lower limit on the area is not restricted severely; however, it may be preferable to select it to be 0.01 m$^2$ or more from an economic point of view.

EXAMPLE

On the surface of one side of a film of polyvinylidene fluoride, resin having a thickness of 9 microns and a width of 150 mm made by suspension polymerization and stretched in one direction, aluminum was deposited entirely on the surface area by vapor-deposition in vacuum; but on the surface of the other side of the film, the same was likewise vapor-deposited except for masked parts of 10 mm width on both lateral sides on the surface so that a layer thichness providing a surface resistance of from 2 to 3 ohms/cm$^2$ was obtained.

The aluminum deposited layer on the latter side surface of the film having the masked parts was removed at narrow regions spaced apart by 3 m, and each extended laterally at right angles to the length of the film so that narrow insulating regions of 10 mm in width were thereby obtained.

The film was then fed into a polarizing device as indicated in FIG. 3 at a speed of 0.5 m/min to be polarized continuously. In the device, the film was brought into contact with the heating drum 15 at 120° C (the circumferential length of the heating part of the drum was 2.5 m) with care being exercised not to produce wrinkles on the film, and a D.C. voltage of 700 V was applied thereacross simultaneously. The film was then cooled with the cooling drum 16 at 15° C. The residual voltage potential remaining between the electrodes after a discrete unit conductive layer left the anode drum was removed by the grounded electrode 17, and thereafter the film was rolled up on the film roll 18. The piezoelectric constant $d_{31}$ of the film (other than the insulating regions) was in the range of from 7.2 to 7.5 $\times 10^{-7}$ c.g.s.e.s.u.

In this case, although break-down through the thus polarized film occurred in the part of the film which was contacting the surface of the heating drum, a short circuit through these points could be prevented or cured by the self-curing effect caused by the spattering away of the deposited aluminum, and the diameters of the regions from where aluminum spattered away were less than 0.3 mm, thus providing a practically usable polarized film.

Continuous polarization was attempted under the same condition as in the above-described case and in an apparatus having sufficient insulation, on a roll of film having 100 m length with aluminum deposition as described above but with no narrow insulating regions along the length, and it was found that a greater amount of electric charge was discharged through the break-down points, and the diameter of the spattered away part, producing the self-curing effect was in the range of from 1 to 5 mm. Furthermore, the part surrounding the broken-down region was carbonized and permanently short-circuited on the film winding drum, and therefore, an industrially usable or practicable polarization could not be achieved.

We claim:

1. In a method for continuously polarizing thermoplastic film wherein a long thermoplastic film having electrically conductive layers deposited on both surfaces of the film is continuously passed through a polarizing zone, and a D.C. electric field is applied across the electrically conductive layers thereby to polarize the thermoplastic film passing through the zone at a polarizing temperature higher than 50° C and lower than the softening point of the film, the improvement comprising the step of forming at least one of the electrically conductive layers into a plurality of sections separated by narrow insulating regions disposed approximately at right angles to the longitudinal dimension of the thermoplastic film and extending transversely across the width thereof.

2. A method as claimed in claim 1, further comprising the step of similarly forming the other of the electrically conductive layers into a plurality of sections separated by narrow insulating regions disposed approximately at right angles to the longitudinal dimension of the film.

3. A method as defined in claim 1, further comprising the step of forming the other of the electrically conductive layers so that it is continuous in the direction of the longitudinal dimension of the film.

4. A method as defined in claim 1, further comprising, after the film is polarized, the step of removing the applied D.C. field and electric charges stored on the electrically conductive layers.

5. A method for continuously polarizing thermoplastic film as claimed in claim 4, wherein the polarizing temperature is higher than 80° and lower than 150° C, and further comprising the step of reducing the temperature of the polarized film to lower than 80° C before removing the D.C. field.

6. A method for continuously polarizing thermoplastic film as claimed in claim 1, wherein each of the narrow insulating regions has a width in the range of 2 mm to 50 mm.

7. A method for continuously polarizing thermoplastic film as claimed in claim 1, wherein the thermoplastic film is polyvinylidene fluoride film.

8. A method for continuously polarizing thermoplastic film as claimed in claim 4, wherein the thermoplastic film is polyvinylidene fluoride film.

* * * * *